US008900992B2

(12) United States Patent
Bhat et al.

(10) Patent No.: US 8,900,992 B2
(45) Date of Patent: *Dec. 2, 2014

(54) METHODS OF FORMING A RUTHENIUM MATERIAL, METHODS OF FORMING A CAPACITOR, AND RELATED ELECTRONIC SYSTEMS

(71) Applicant: Micron Technology, Inc., Boise, ID (US)

(72) Inventors: Vishwanath Bhat, Boise, ID (US); Dan Gealy, Kuna, ID (US); Vassil Antonov, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 13 days.

This patent is subject to a terminal disclaimer.

(21) Appl. No.: 13/950,583

(22) Filed: Jul. 25, 2013

(65) Prior Publication Data

US 2013/0307120 A1 Nov. 21, 2013

Related U.S. Application Data

(60) Continuation of application No. 13/407,185, filed on Feb. 28, 2012, now Pat. No. 8,513,807, which is a division of application No. 12/100,632, filed on Apr. 10, 2008, now Pat. No. 8,124,528.

(51) Int. Cl.
*H01L 21/44* (2006.01)

(52) U.S. Cl.
USPC .................................. 438/654; 257/E21.648

(58) Field of Classification Search
USPC ........................... 438/654, 655, 682, 680, 681
See application file for complete search history.

(56) References Cited

U.S. PATENT DOCUMENTS

| 5,372,849 | A | 12/1994 | McCormick et al. |
| 5,962,716 | A | 10/1999 | Uhlenbrock et al. |
| 6,063,705 | A | 5/2000 | Vaartstra |
| 6,197,628 | B1 * | 3/2001 | Vaartstra et al. ............. 438/238 |
| 6,281,125 | B1 | 8/2001 | Vaartstra et al. |
| 6,437,417 | B1 | 8/2002 | Gilton |
| 6,461,909 | B1 | 10/2002 | Marsh et al. |
| 6,462,367 | B2 | 10/2002 | Marsh et al. |
| 6,465,828 | B2 | 10/2002 | Agarwal |
| 6,734,100 | B2 | 5/2004 | Park et al. |
| 6,737,313 | B1 | 5/2004 | Marsh et al. |
| 6,764,895 | B2 | 7/2004 | Marsh et al. |
| 6,824,816 | B2 | 11/2004 | Aaltonen et al. |
| 6,846,711 | B2 | 1/2005 | Yamasaki |

(Continued)

FOREIGN PATENT DOCUMENTS

| JP | 11340435 A | 12/1999 |
| JP | 2001036027 A | 2/2001 |
| JP | 2007067015 A | 3/2007 |
| KR | 1020030051231 A | 6/2003 |

OTHER PUBLICATIONS

Jaworek, A., Electrospray Droplet Sources for Thin Film Deposition, J. Mater. Sci., vol. 42, (2007), pp. 266-297.

(Continued)

*Primary Examiner* — Reema Patel
(74) *Attorney, Agent, or Firm* — TraskBritt

(57) ABSTRACT

Methods for forming ruthenium films and semiconductor devices, such as capacitors, that include the films are provided.

19 Claims, 4 Drawing Sheets

(56) References Cited

U.S. PATENT DOCUMENTS

| | | |
|---|---|---|
| 6,867,090 B2 | 3/2005 | Hiratani et al. |
| 7,002,033 B1 | 2/2006 | Sakai et al. |
| 7,098,128 B2 * | 8/2006 | Collins et al. ............... 438/620 |
| 7,148,555 B2 | 12/2006 | Yates et al. |
| 7,273,814 B2 * | 9/2007 | Matsuda ....................... 438/680 |
| 8,124,528 B2 * | 2/2012 | Bhat et al. .................... 438/654 |
| 8,513,807 B2 * | 8/2013 | Bhat et al. .................... 257/757 |
| 2001/0020715 A1 | 9/2001 | Yamasaki et al. |
| 2002/0013052 A1 | 1/2002 | Visokay |
| 2002/0142538 A1 | 10/2002 | Marsh et al. |
| 2003/0015769 A1 | 1/2003 | DeBoer et al. |
| 2003/0109110 A1 * | 6/2003 | Kim ............................. 438/398 |
| 2003/0213986 A1 | 11/2003 | Takamatsu et al. |
| 2005/0020060 A1 | 1/2005 | Aaltonen et al. |
| 2005/0161710 A1 | 7/2005 | DeBoer et al. |
| 2005/0221002 A1 | 10/2005 | Nakamura et al. |
| 2005/0238808 A1 | 10/2005 | Gatineau et al. |
| 2006/0145294 A1 | 7/2006 | Bhat et al. |
| 2006/0177601 A1 | 8/2006 | Park et al. |
| 2006/0251813 A1 | 11/2006 | Carlson et al. |
| 2006/0273426 A1 | 12/2006 | Iijima |
| 2007/0037392 A1 | 2/2007 | Thompson |
| 2007/0082132 A1 | 4/2007 | Shinriki et al. |
| 2007/0111434 A1 | 5/2007 | Ikeda |
| 2007/0148896 A1 | 6/2007 | Nakamura et al. |
| 2007/0160756 A1 | 7/2007 | Treichel |
| 2007/0190781 A1 | 8/2007 | Wai et al. |
| 2007/0190782 A1 | 8/2007 | Park |
| 2007/0207588 A1 | 9/2007 | Basceri et al. |
| 2007/0218205 A1 | 9/2007 | Hendrix et al. |
| 2007/0218316 A1 | 9/2007 | Inomata |
| 2007/0231927 A1 | 10/2007 | Yamakawa et al. |
| 2007/0264838 A1 | 11/2007 | Krishnan et al. |
| 2009/0022891 A1 | 1/2009 | Sakai et al. |
| 2009/0035466 A1 | 2/2009 | Kawano et al. |
| 2009/0080122 A1 * | 3/2009 | Freitag et al. .............. 360/324.1 |
| 2009/0257170 A1 | 10/2009 | Bhat et al. |
| 2012/0161282 A1 | 6/2012 | Bhat et al. |

OTHER PUBLICATIONS

Miki et al., Highly reliable MIS capacitors with plasma nitridation and doubled dielectric-constant tantalum pentoxide, , IEEE Transactions on Electron Devices, vol. 52, No. 8, Aug. 2005, pp. 1832-1837, abstract only.

Terry, David B., Dissertation of a Holistic Investigation of Alternative Gate Stack Materials for Future CMOS Applications, North Carolina State University, (2006), pp. i-127.

* cited by examiner

METHODS OF FORMING A RUTHENIUM MATERIAL, METHODS OF FORMING A CAPACITOR, AND RELATED ELECTRONIC SYSTEMS

CROSS REFERENCE TO RELATED APPLICATIONS

This application is a continuation of U.S. patent application Ser. No. 13/407,185, filed Feb. 28, 2012, now U.S. Pat. No. 8,513,807, issued Aug. 20, 2013, which application is a divisional of U.S. patent application Ser. No. 12/100,632, filed Apr. 10, 2008, now U.S. Pat. No. 8,124,528, issued Feb. 28, 2012, the disclosure of each of which is hereby incorporated herein in its entirety by this reference.

TECHNICAL FIELD

Embodiments of the present disclosure relate to the field of semiconductor manufacture and, more particularly, to methods of forming a ruthenium metal layer in the fabrication of a semiconductor device, and devices resulting from those methods.

BACKGROUND OF THE INVENTION

Crystallographically textured tantalum oxide ($Ta_2O_5$) demonstrates approximately twice the dielectric permittivity of amorphous $Ta_2O_5$, making c-axis textured $Ta_2O_5$ very attractive as a DRAM cell dielectric. Metallic ruthenium is the bottom cell plate of choice for crystallographically textured, high permittivity $Ta_2O_5$ cell dielectrics because the $Ta_2O_5$ orders on the hexagonal close-packed (hcp) ruthenium structure and provides the high permittivity texturing.

Historically, there have been adhesion issues when ruthenium is deposited on silicon dioxide ($SiO_2$) and other dielectric films. This adhesion issue on oxide dielectrics has been addressed by adding disilane ($Si_2H_6$) to the initial stages of ruthenium deposition. However, X-ray photoelectron spectrometry (XPS) analysis and secondary ion mass spectrography (SIMS) show that about 20 atomic percent silicon is present at the top surface of the deposited ruthenium film, which adversely affects the desired crystographically textured $Ta_2O_5$ deposition.

It would be desirable to provide a process for fabricating a ruthenium film that overcomes these problems.

BRIEF DESCRIPTION OF THE DRAWINGS

Embodiments of the invention are described below with reference to the following accompanying drawings, which are for illustrative purposes only.

DETAILED DESCRIPTION OF THE INVENTION

The following description provides illustrative examples of devices and methods according to embodiments of the present disclosure. Such description is for illustrative purposes only and not for purposes of limiting the same.

In the context of the current application, the terms "semiconductor substrate" or "semiconductive substrate" or "semiconductive wafer fragment" or "wafer fragment" or "wafer" will be understood to mean any construction comprising semiconductor material, including, but not limited to, bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

An embodiment of a method according to the invention is described with reference to FIGS. 1-6, in a method of forming an electrode in a capacitor construction.

Figure 1:
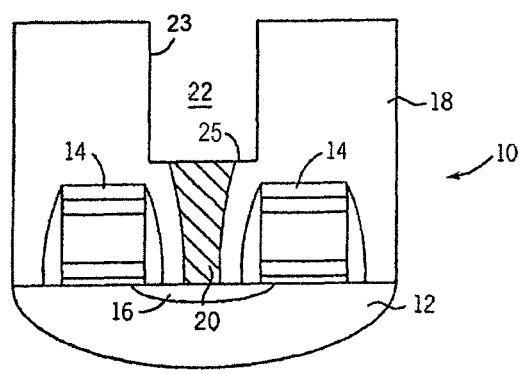
FIG. 1 is a diagrammatic cross-sectional view of a substrate at a preliminary step of a processing sequence.

Referring to FIG. 1, a substrate 10 (e.g., a wafer) is shown at a preliminary processing step in the formation of a capacitor. The substrate 10 in progress can comprise, for example, a semiconductor wafer substrate or the wafer along with various process layers formed thereon, including one or more semiconductor layers or other formations, and active or operable portions of semiconductor devices.

In the illustrated embodiment, the substrate 10 comprises a material layer 12 such as polysilicon, wordlines 14, and a diffusion region (active area) 16 formed in the material layer 12 between the wordlines 14, the diffusion region 16 being in the form of a source/drain region. A dielectric (insulative) material 18, such as borophosphosilicate glass (BPSG), phosphosilicate glass (PSG), or other oxide (e.g., $SiO_x$, TEOS (tetraethyl orthosilicate), etc.) or other suitable insulative material, has been formed on the material layer 12 and over the wordlines 14. A plug 20 comprising doped polycrystalline has been deposited into an opening through the dielectric material 18 as an electrical contact with the diffusion region 16. The foregoing structures can be formed by conventional methods known and used in the art. A container or opening 22 with sidewalls 23 and a base portion or floor 25, has been conventionally etched into the insulative layer 18 to expose the plug 20.

A lower electrode of ruthenium is then formed within the opening 22 within the insulative material layer 18.

Figure 2:
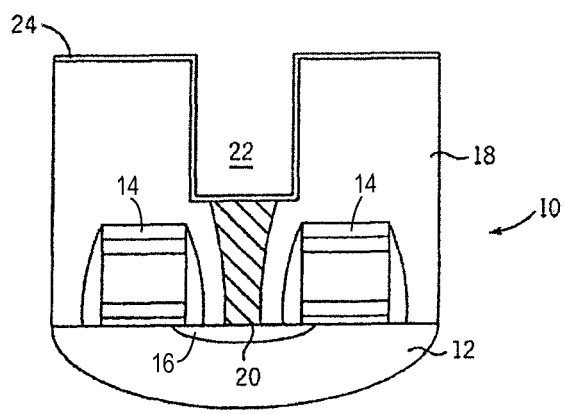
FIGS. 2-6 are views of the substrate of FIG. 1 at subsequent processing steps according to according to an embodiment of the invention.

Referring to FIG. 2, according to an embodiment of a method of the invention, an adhesion layer or nucleation (seed) layer 24 is formed on the insulative material layer 18 within the opening to improve adherence of the subsequently deposited ruthenium electrode layer to the insulative material layer 18. An adhesion layer 24 composed of ruthenium silicide ($RuSi_x$) can be formed, for example, by sputter depositing from a deposition target of $RuSi_x$, by physical vapor deposition (PVD) of $RuSi_x$, by atomic layer deposition (ALD), or by chemical vapor deposition (e.g., CVD, LPCVD, APCVD, PECVD, etc.) using a silicon precursor gas and a ruthenium precursor gas.

In other embodiments, the adhesion (seed) layer 24 can be composed of $RuSi_xO_y$ and formed, for example, by a process as described, for example, in U.S. Pat. No. 6,461,909 to Marsh et al.

In the illustrated embodiment, an $RuSi_x$ adhesion layer 24 is formed by CVD, for example, by exposing the substrate 10 to a gaseous mixture of a silicon precursor gas and a ruthenium precursor gas at a ratio of about 50:1 to about 1:1 for a duration of about 0.5-20 seconds, or about 1-10 seconds to form the adhesion layer 24 to a thickness of about 1-20 angstroms, or about 1-10 angstroms. In embodiments of the method, the flow rate of the silicon precursor is about 1-100 sccm (or about 20-80 sccm), the flow rate of the ruthenium precursor is about 1-20 sccm (or about 1-10 sccm), and the flow rate of an optional carrier gas is about 50-1000 sccm (or about 200-500 sccm). General CVD processing parameters include a deposition pressure of about 0.1-20 torr, and a deposition temperature at the substrate surface of about 100° C. to 700° C. or about 200° C. to 500° C.

In some embodiments, the silicon precursor is initially deposited onto the insulative material layer 18 to form a thin seed layer ranging from a monolayer (e.g., about 2 angstroms to about 5 angstroms thick). Both the silicon and ruthenium precursors can then be flowed into the reaction chamber to deposit the $RuSi_x$ adhesion layer 24.

Examples of silicon precursor gases include a silicon hydride or silane such as silane ($SiH_4$), disilane ($Si_2H_6$), trisilane ($Si_3H_8$), dichlorosilane (DCS, $SiH_2Cl_2$), trichlorosilane (TCS, $SiHCl_3$), hexachlorodisilane ($Si_2Cl_6$), trisilylamine ($N(SiH_3)_3$), methylated silanes, among others.

Any ruthenium containing precursor can be used in accordance with the present disclosure. Typical ruthenium precursors for CVD deposition include liquid ruthenium metal-organic precursors. The ruthenium precursor can be contained in a bubbler reservoir through which a carrier gas, such as helium or any other inert gas (e.g., nitrogen, argon, neon, and xenon), is bubbled through the reservoir containing the precursor to deliver the precursor to a reaction chamber. For example, a carrier gas having a volumetric flow rate in the range of about 1-500 sccm can be used in a bubbler reservoir having a pressure in the range of about 0.5-50 torr and a temperature in the range of about 30° C. to 70° C. to deliver a ruthenium precursor to the reaction chamber.

Ruthenium precursors include liquid ruthenium complexes of the following formula: $(diene)Ru(CO)_3$, wherein "diene" refers to linear, branched, or cyclic dienes, bicyclic dienes, tricyclic dienes, fluorinated derivatives thereof, combinations thereof, and derivatives thereof additionally containing heteroatoms such as halide, Si, S, Se, P, As, or N, as described, for example, in U.S. Pat. Nos. 6,063,705 and 5,962,716.

For example, the ruthenium precursor can be a ruthenocene having the formula $(Cp')Ru$ or $(Cp')Ru(Cp'')$, where Cp' and Cp" can be the same or different and have the following formula:

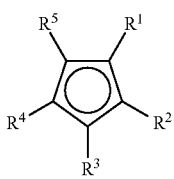

wherein $R^1$-$R^5$ can be independently selected from the group consisting of H, F, and straight-chained or branched $C_1C_5$ alkyl groups (e.g., Me, Et, i-propyl, n-propyl, t-butyl, n-butyl, sec-butyl, n-amyl, i-amyl, t-amyl, etc.). Nonlimiting examples of suitable ruthenocenes include bis(cyclopentadienyl)ruthenium, bis(ethylcyclopentadienyl)ruthenium, and bis(pentamethylcyclopentadienyl)ruthenium.

The ruthenium precursor can also be a ruthenium β-diketonate having the formula $Ru(\beta\text{-diketonate})_3$, wherein the β-diketonate has the formula:

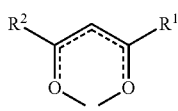

wherein $R^1$ and $R^2$ can be independently selected from the group consisting of H, F, straight-chained or branched $C_1$-$C_5$ alkyl groups (e.g., Me, Et, i-propyl, n-propyl, t-butyl, n-butyl, sec-butyl, n-amyl, t-amyl, etc.), and fluorine-substituted straight-chained or branched $C_1$-$C_5$ alkyl groups (e.g., Me, Et, i-propyl, n-propyl, t-butyl, n-butyl, sec-butyl, n-amyl, i-amyl, t-amyl, etc.). Nonlimiting examples of β-diketonates include 2,4-pentanedionate; 1,1,1-trifluoro-2,4-pentanedionate; 2,2,6,6-tetramethyl-3,5-heptanedionate; 1,1,1,5,5,5-hexafluoro-2,4-pentanedionate; 2,2,7-tetramethyl-3,5-octanedionato; 6,6,7,7,8,8,8-heptafluoro-2,2-dimethyl-3,5-octanedionato; and 2,4-octanedionato. In an embodiment, $R^1$ and $R^2$ are independently selected from the group consisting of $C_1$-$C_5$ fluoroalkyl groups.

The ruthenium precursor can also be a ruthenium carbonyl such as $Ru(CO)_5$, $Ru_3(CO)_{12}$, $Ru(CO)_9$, $(C_6H_8)Ru(CO)_3$, and $(C_7H_{10})Ru(CO)_3$, and cyclopentadienyl dicarbonyl ruthenium (II) dimer.

Additional precursors and methods of depositing ruthenium layers are generally discussed in U.S. Pat. No. 5,372,849 to McCormick et al. (Minnesota Mining and Manufacturing Company (St. Paul, Minn.)).

A carrier gas can be used to deliver the precursor gas(es) to the reaction chamber, for example, an inert gas such as helium, nitrogen, neon, xenon, and/or argon. Optionally, a carrier or dilution gas (e.g., He, Ar, etc.) can be introduced into the reaction chamber to alter the concentrations of the gases therein, for example, at a varied flow rate. Oxidizing gases can also be introduced into the reaction chamber when desired.

Figure 3:
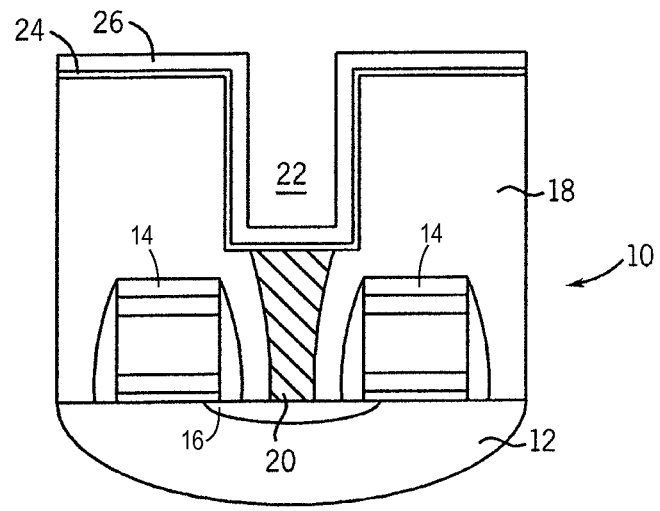

Referring now to FIG. 3, a ruthenium layer or film 26 is then formed on the adhesion or nucleation (seed) layer 24 by chemical vapor deposition processing (e.g., CVD, LPCVD, APCVD, PECVD, etc.). The flow of the silicon precursor is terminated and a hydrogen source gas is flowed with the ruthenium precursor gas to form a hydrogen-treated ruthenium layer 26. In embodiments of the method, the hydrogen source gas is hydrogen gas ($H_2$), and in other embodiments, ammonia ($NH_3$) is used. Optionally, a carrier gas (e.g., He, Ar, etc.) can be used. CVD processing conditions can be as described for forming the $RuSi_x$ adhesion layer 24. The ruthenium layer 26 can by formed by CVD, for example, by exposing the substrate 10 to a gaseous mixture of a ruthenium precursor gas and a hydrogen source gas (e.g., $H_2$ or $NH_3$) at a ratio of about 0.001:1 to about 1:1 for a duration effective to deposit the desired thickness, generally at least about 100 angstroms, e.g., about 100-300 angstroms, or about 150-250 angstroms. In embodiments of the method, the flow rate of the ruthenium precursor is about 1-20 sccm (or about 1-10 sccm), and the flow rate of the hydrogen source gas is at least about 200 sccm, and in other embodiments at least about 400 sccm (e.g., about 400-600 sccm). The flow rate of an optional carrier gas can be about 50-1000 sccm (or about 200-600 sccm). In an embodiment, the ruthenium precursor gas flows continuously during CVD processing as the flow of the silicon precursor gas is terminated and flow of the hydrogen source gas is commenced.

The incorporation of hydrogen in the ruthenium layer 26 functions to reduce or eliminate the diffusion of silicon into the bulk ruthenium layer to below detectable levels, particularly in the upper surface of the ruthenium layer 26 (e.g., to a depth of about 10-30 angstroms). The incorporation of hydrogen can further function to promote densification and reduce the porosity of the ruthenium layer 26, increase the stability of the ruthenium layer in air, and improve the uniformity of the ruthenium layer.

Figure 4:
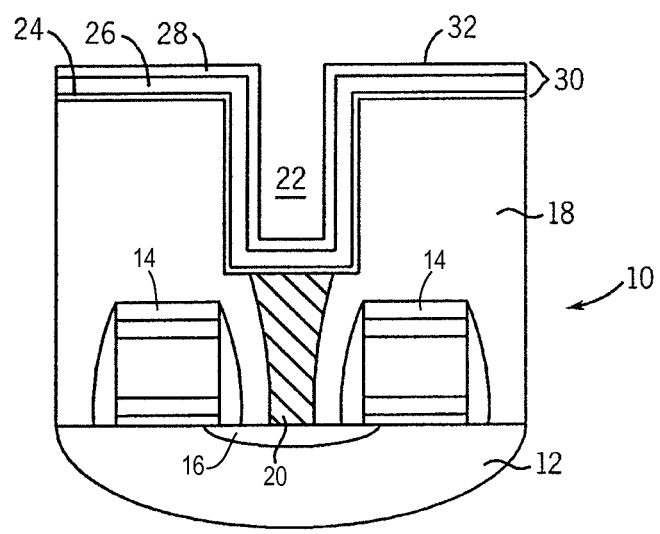

Optionally, as depicted in FIG. 4, in some embodiments, the flow of the hydrogen source gas can be terminated and the ruthenium precursor gas can be flowed to form an additional ruthenium layer 28 over the hydrogen-treated ruthenium layer 26. The ruthenium layer 28 can be formed to a desired thickness at about 0 angstroms to 300 angstroms, or about 0 angstroms to 100 angstroms. The combined layers 24, 26, 28 form a lower electrode 30, which typically has a total thickness of about 50 angstroms to 300 angstroms, or about 50 angstroms to 100 angstroms.

Due, at least in part, to the addition of the hydrogen source gas during the formation of the ruthenium material layer 26, diffusion of silicon from the initial adhesion (seed) layer 24 into the upper portion of the hydrogen-treated ruthenium layer 26 is eliminated and a surface 32 of the ruthenium electrode 30 is substantially or completely silicon-free, i.e., 0 atomic percent to 0.01 atomic percent silicon by X-ray photoelectron spectroscopy (XPS) and/or secondary ion mass spectroscopy (SIMS) analysis. The resulting ruthenium electrode 30 is a graded layer with the content (atomic percent) of ruthenium increasing and the silicon concentration decreasing from the adhesion layer (e.g., $RuSi_x$) 24 to the surface 32 of the ruthenium electrode 30 (e.g., the surface of the hydrogen-treated ruthenium layer 26). In some embodiments, the ruthenium electrode 30 is a graded layer in which the adhesion layer 24 (e.g., $RuSi_x$) has a high silicon content of about 10 atomic percent to 90 atomic percent and ruthenium content of about 10 atomic percent to 90 atomic percent, with the silicon content decreasing progressively through the hydrogen-treated ruthenium layer 26 to a non-detectable level (i.e., 0 atomic percent to 0.01 atomic percent) at the surface 32 of the ruthenium electrode 30. In some embodiments, the ruthenium electrode 30 has a surface atomic concentration of ruthenium greater than about 50 atomic percent, or about 50 atomic percent to 80 atomic percent with the resistivity of the film at about 100-1,000% of the bulk ruthenium.

The resulting electrode 30 has a lowered resistivity (Rs value), improved film uniformity, and higher film stability, e.g., in an ambient environment, with little or no degradation occurring upon exposure to air.

Figure 5:
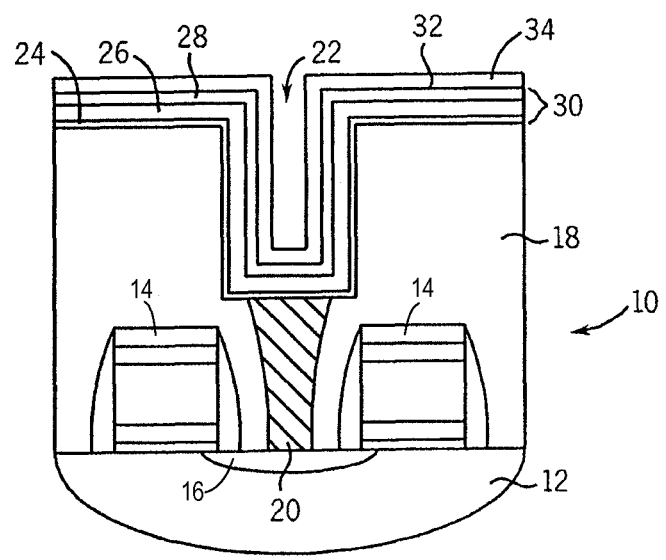

Referring now to FIG. 5, a dielectric (insulating) layer 34 is formed on the surface 32 of the ruthenium electrode 30. In embodiments of the invention, the dielectric layer 34 comprises a dielectric material having a high dielectric constant, for example, greater than about 7, or greater than about 50. In some embodiments, the dielectric layer 34 comprises tantalum oxide $Ta_2O_5$, and/or other metal oxide dielectric material, for example, barium strontium titanate ($Ba_xSr_{(1-x)}TiO_3$ (BST) where 0<x,1), $BaTiO_3$, $SrTiO_3$, $PbTiO_3$, $Pb(Zr,Ti)O_3$ (PZT), $(Pb,La)(Zr,Ti)O_3$ (PLZT), $(Pb,La)TiO_3$, (PLT), $Ta_2O_5$, $KNO_3$, $LiNbO_3$, $HfO_2$, and/or $Al_2O_3$, among others. The dielectric layer 34 can be formed by conventional methods, for example, RF-magnetron sputtering, chemical vapor deposition (CVD), or other suitable deposition method. The dielectric layer 34 (e.g., $Ta_2O_5$) formed on the ruthenium electrode 30 is properly crystallized with a textured, hexagonal crystalline structure or phase, or will crystallize upon a moderate (about 400° C. to 650° C.) thermal anneal.

The dielectric layer can also be formed from a low-k dielectric material, for example, $SiO_2$, $Si_3N_4$, or a composite thereof.

Figure 6:
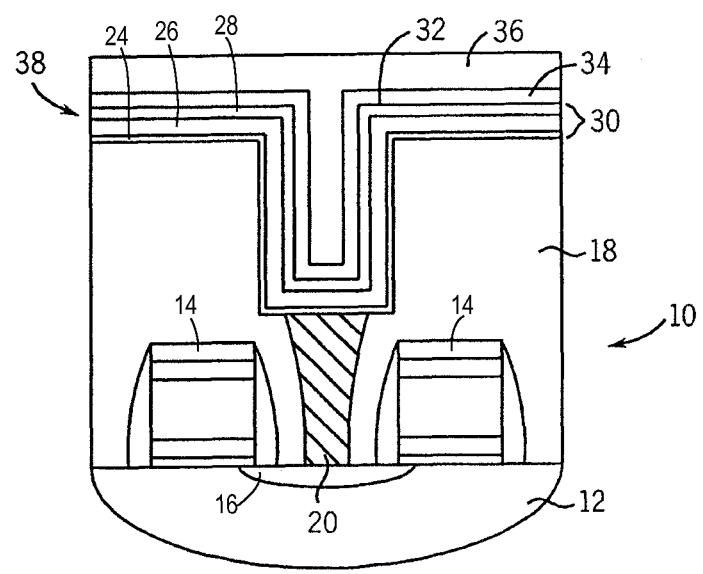

As illustrated in FIG. 6, a conductive material is then deposited to form a top electrode or plate 36 of a capacitor 38. The top electrode 36 can be formed of any conductive material, for example, a metal (e.g., ruthenium, platinum, rhodium, etc.), a conductive metal oxide (e.g., ruthenium oxide, iridium oxide, etc.), or doped polysilicon. The layers can then be patterned by known techniques as conventional in the art, and the substrate 10 further processed as desired.

Figure 7:
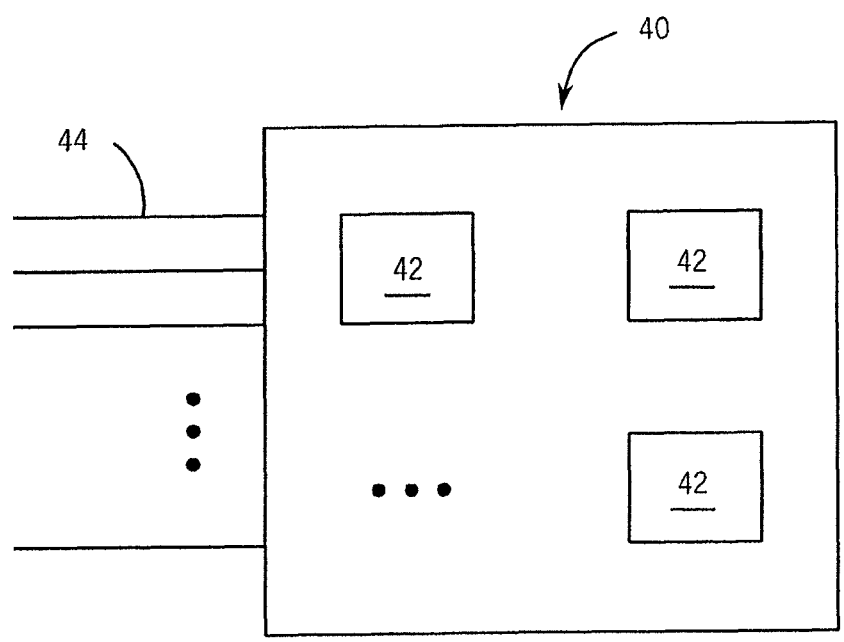
FIG. 7 is a block diagram of a circuit module according to an embodiment of the present invention.

FIG. 7 is a block diagram of an embodiment of a circuit module 40 in which the present invention can be incorporated. Such modules, devices and systems (e.g., processor systems) incorporating such a module are described and illustrated in U.S. Pat. No. 6,437,417 (Gilton) and U.S. Pat. No. 6,465,828 (Agarwal), the disclosures of which are incorporated by reference herein. In brief, two or more dice 42 may be combined into a circuit module 40 to enhance or extend the functionality of an individual die 42. Circuit module 40 can be a combination of dice 42 representing a variety of functions, or a combination of dice 42 containing the same functionality. One or more dice 42 of the circuit module 40 can contain circuitry, or integrated circuit devices that include at least one ruthenium layer 30 or capacitor 30 or other device incorporate the ruthenium layer 30 in accordance with the embodiments of the present invention. The integrated circuit devices can include a memory cell that comprises a ruthenium layer as discussed in the various embodiments in accordance with the invention.

Some examples of a circuit module include memory modules, device drivers, power modules, communication modems, processor modules, and application-specific modules, and may include multi-layer, multi-chip modules. Circuit module 40 can be a subcomponent of a variety of electronic systems, such as a clock, a television, a cell phone, a personal computer, an automobile, an industrial control system, or an aircraft, among others. Circuit module 40 will have a variety of leads 44 extending therefrom and coupled to the dice 42 providing unilateral or bi-lateral communication and control.

The circuit module 40 can be incorporated, for example, into an electronic system that comprises a user interface, for example, a keyboard, monitor, display, printer, speakers, etc. One or more circuit modules can comprise a microprocessor that provides information to the user interface, or is otherwise programmed to carry out particular functions as is known in the art. The electronic system can comprise, for example, a computer system including a processor and a memory system as a subcomponent, and optionally user interface components, and other associated components such as modems, device driver cards, etc. Examples of memory circuits include, but are not limited to, DRAM (Dynamic Random Access Memory), SRAM (Static Random Access Memory), flash memories, a synchronous DRAM, such as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging memory technologies.

Although specific embodiments have been illustrated and described herein, it will be appreciated by those of ordinary skill in the art that any arrangement that is calculated to achieve the same purpose can be substituted for the specific embodiments shown. This application is intended to cover any adaptations or variations that operate according to the principles of this disclosure as described herein. It is therefore intended that such changes and modifications be covered by the appended claims and the equivalents thereof The disclosures of patents, references and publications cited in the application are incorporated by reference herein.

What is claimed is:
1. A method of forming a ruthenium material on a substrate, comprising:
   forming a seed material comprising ruthenium silicide on a dielectric material by atomic layer deposition or chemical vapor deposition;

forming a ruthenium silicide material on the seed material; and forming a ruthenium material on the ruthenium silicide material to have an exposed surface of the ruthenium material substantially free of silicon.

2. The method of claim 1, wherein forming a ruthenium silicide material on the seed material comprises exposing the seed material to a gaseous mixture of a silicon precursor gas and a ruthenium precursor gas.

3. The method of claim 1, wherein forming a ruthenium silicide material on the seed material comprises exposing the seed material to a silicon precursor gas selected from the group consisting of at least one of silane, disilane, trisilane, dichlorosilane, trichlorosilane, hexachlorodisilane, and a methylated silane.

4. The method of claim 1, wherein forming a ruthenium material on the ruthenium silicide material comprises forming the ruthenium material comprising a decreasing concentration of silicon between a surface of the ruthenium material adjacent the ruthenium silicide material to the exposed surface of the ruthenium material.

5. The method of claim 1, wherein forming a ruthenium material comprises forming a ruthenium material having the exposed surface with a silicon content of between 0 atomic percent and 0.01 atomic percent.

6. The method of claim 1, wherein forming a ruthenium material comprises exposing the ruthenium silicide material to a hydrogen source gas and a ruthenium precursor gas.

7. The method of claim 6, wherein exposing the ruthenium silicide material to a hydrogen source gas comprises exposing the ruthenium silicide material to a hydrogen source gas selected from the group consisting of hydrogen and ammonia.

8. The method of claim 1, further comprising forming another ruthenium material over the ruthenium material and exhibiting a greater porosity than a porosity of the ruthenium material.

9. A method of forming a ruthenium material on a substrate, comprising:

forming a ruthenium silicide material on a substrate; and forming a hydrogen-treated ruthenium material on the ruthenium silicide material to form an electrode having an exposed surface substantially free of silicon and comprising a decreasing concentration of silicon between the ruthenium silicide material and the exposed surface.

10. The method of claim 9, wherein forming an electrode comprises forming the electrode comprising a gradient of ruthenium concentration increasing from the ruthenium silicide material to the exposed surface of the hydrogen-treated ruthenium material.

11. A method of forming a capacitor, comprising:

forming an adhesion material comprising silicon and ruthenium on a substrate;

forming a hydrogen-treated ruthenium material comprising a decreasing concentration of silicon from an interface between the adhesion material and the hydrogen-treated ruthenium material to an exposed surface of the hydrogen-treated ruthenium material, the exposed surface substantially free of silicon;

forming another ruthenium material on the hydrogen-treated ruthenium material;

forming a dielectric material on the another ruthenium material; and forming a conductive material on the dielectric material.

12. The method of claim 11, wherein forming a hydrogen-treated ruthenium material comprises exposing the adhesion material to a ruthenium precursor gas and a hydrogen source gas.

13. The method of claim 11, wherein forming an adhesion material comprising silicon and ruthenium comprises forming an adhesion material overlying and at least partially in contact with a conductive plug material.

14. The method of claim 11, wherein forming an adhesion material comprising silicon and ruthenium and forming a hydrogen-treated ruthenium material comprises forming an electrode of the capacitor.

15. The method of claim 14, wherein forming an electrode of the capacitor comprises forming a ruthenium-containing electrode comprising a gradient of silicon, the silicon concentration decreasing from an unexposed surface of the electrode to an exposed surface of the electrode.

16. The method of claim 11, wherein forming a hydrogen-treated ruthenium material comprises exposing the adhesion material to a ruthenium precursor gas and hydrogen gas.

17. The method of claim 11, wherein forming another ruthenium material comprises terminating a flow of a hydrogen source gas and exposing the hydrogen-treated ruthenium material to a ruthenium precursor gas.

18. An electronic system, comprising:

a processor; and an integrated circuit in communication with the processor, the integrated circuit comprising a ruthenium material overlying and in contact with a material comprising silicon and ruthenium, the ruthenium material having a surface with a silicon content of between 0 atomic percent and 0.01 atomic percent.

19. The electronic system of claim 18, wherein the integrated circuit is a memory circuit.

* * * * *